(12) United States Patent
Liu

(10) Patent No.: US 7,692,925 B1
(45) Date of Patent: Apr. 6, 2010

(54) HEAT DISSIPATION DEVICE

(75) Inventor: Peng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/328,780

(22) Filed: Dec. 5, 2008

(30) Foreign Application Priority Data

Sep. 22, 2008  (CN)  .................. 2008 2 0302203

(51) Int. Cl.
*H05K 7/20* (2006.01)
*G01F 1/20* (2006.01)

(52) U.S. Cl. ............. 361/700; 361/679.47; 361/679.48; 361/679.52; 361/679.54; 361/695; 361/697; 361/703; 361/704; 361/709; 361/710; 165/80.3; 165/104.33; 165/185; 174/15.2; 174/16.1; 174/16.3

(58) Field of Classification Search ................................ 361/679.46–679.48, 679.5, 679.52, 679.54, 361/690, 694–695, 698–700, 702–704; 165/80.3–80.5, 165/104.33, 185; 174/15.2, 16.1, 16.3
See application file for complete search history.

(56) References Cited

U.S. PATENT DOCUMENTS

| | | | |
|---|---|---|---|
| 6,189,601 B1 * | 2/2001 | Goodman et al. .......... 165/80.3 |
| 6,917,522 B1 * | 7/2005 | Erturk et al. ................. 361/700 |
| 7,044,197 B2 * | 5/2006 | Lee et al. .................... 165/80.3 |
| 7,152,666 B2 * | 12/2006 | Chen et al. .................. 165/80.3 |
| 7,167,364 B2 * | 1/2007 | Lopatinsky et al. ......... 361/697 |
| 7,277,287 B2 * | 10/2007 | Chen et al. ................... 361/700 |
| 7,298,620 B2 * | 11/2007 | Wu ............................ 361/700 |
| 7,414,848 B2 * | 8/2008 | Zhou et al. .................. 361/704 |
| 7,443,677 B1 * | 10/2008 | Zhou et al. .................. 361/702 |
| 2007/0215327 A1 * | 9/2007 | Lai et al. ............... 165/104.33 |
| 2008/0156458 A1 * | 7/2008 | Li et al. ..................... 165/80.3 |
| 2008/0295993 A1 * | 12/2008 | Chen et al. ................. 165/80.3 |
| 2009/0151895 A1 * | 6/2009 | Liu ........................... 165/80.2 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipation device includes a base, a first fin unit and two second fin units arranged on the base. The base has a substrate and two parallel heat spreaders extending integrally and perpendicularly from the substrate. The first fin unit is arranged on the substrate and sandwiched between the heat spreaders. A plurality of first channels are defined in the first fin unit and parallel to the heat spreaders. Each of the second fin units is perpendicularly arranged on the substrate and located at a lateral, outer side of one of the heat spreaders. A plurality of second channels are defined in each of the second fin units and extend along a different direction compared to that of the first channels.

6 Claims, 4 Drawing Sheets

HEAT DISSIPATION DEVICE

BACKGROUND OF THE INVENTION

1. Field of the Invention

The present invention relates to a heat dissipation device used in association with electronic components.

2. Description of Related Art

Computer electronic components, such as central processing units (CPUs), generate large amounts of heat during normal operation. If the heat is not properly dissipated, it can adversely affect operational stability of the electronic components and damage associated electronic devices. A heat dissipation device is often attached to a top surface of a CPU to dissipate heat therefrom.

Conventionally, a heat dissipation device includes a base, a plurality of fins arranged on the base with parallel channels defined therebetween, and a plurality of heat pipes connecting the base and the fins. A cooling fan is generally located at a lateral side of the base and the fins to provide cooling air to flow through the channels of the fins, thereby increasing cooling efficiency of the heat dissipation device. However, an extending direction of the channels is single, which could result in a block of the cooling air flowing out of the fins speedily. Furthermore, the unidirectional flow of the cooling air leads to a poor exploitation thereof, which particularly cannot cool other heat sources adjacent to a side of the heat dissipation device perpendicular to the side thereof through which the channels communicate with an outside of the heat dissipation device.

What is needed, therefore, is an improved heat dissipation device which can overcome the described disadvantages.

SUMMARY OF THE INVENTION

A heat dissipation device for cooling electronic components, includes a base, a first fin unit and two second fin units arranged on the base, and a fan mounted on the first and second fin units. The base has a substrate and two parallel heat spreaders extending integrally and perpendicularly from the substrate. The first fin unit is arranged on the substrate and sandwiched between the heat spreaders. A plurality of first channels are defined in the first fin unit and parallel to the heat spreaders. Each of the second fin units is perpendicularly arranged on the substrate and located at a lateral, outer side of one of the heat spreaders. A plurality of second channels are defined in each of the second fin units and extend along a different direction compared to that of the first channels. Cooling air generated by the fan can flow along the first and second channels out of the heat dissipation device multidirectionally. The cooling air can be rapidly sent out to increase the heat dissipation efficiency of the heat dissipation device, as well as used for cooling of other electronic components adjacent to different sides of the heat dissipation device.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
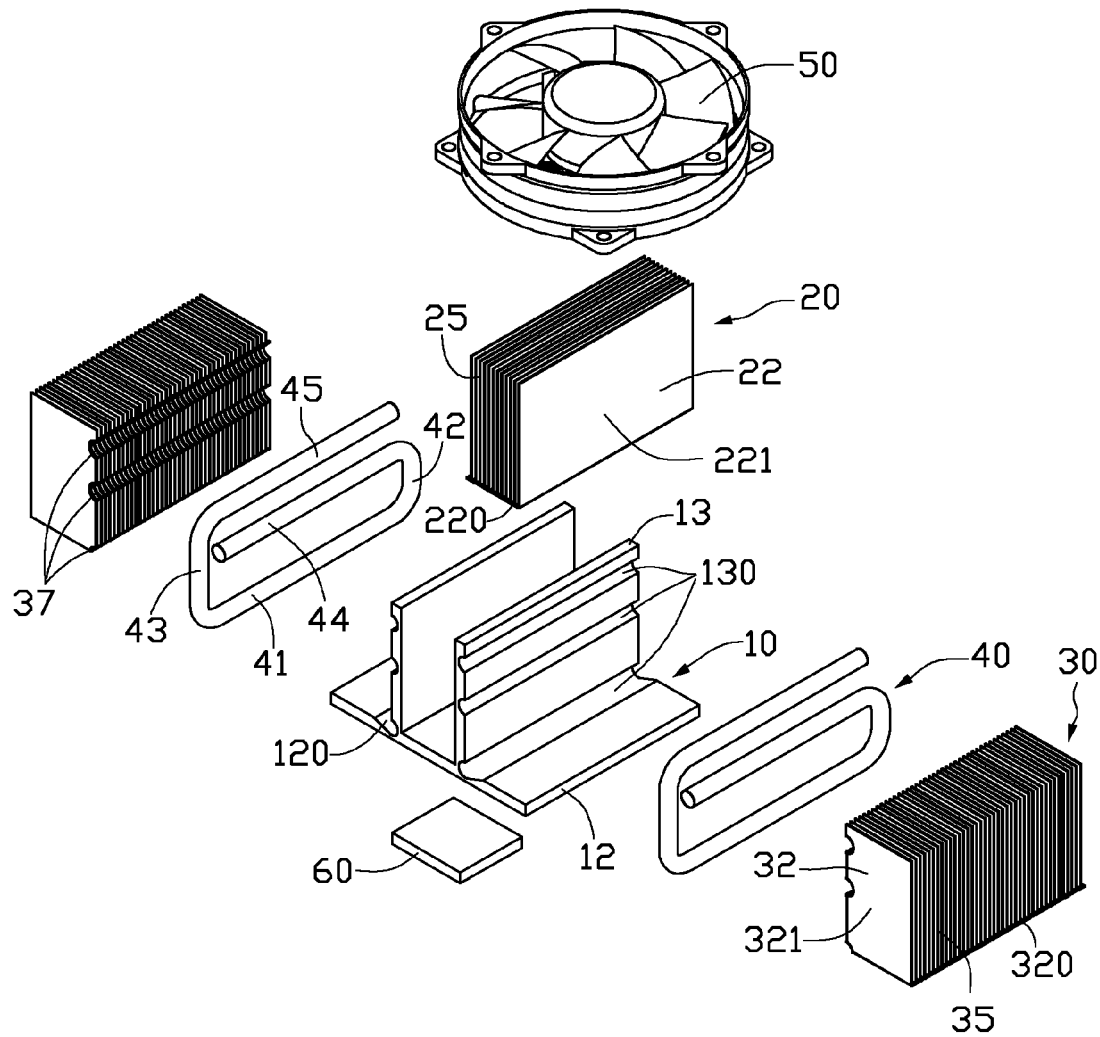
FIG. 1 is an exploded, isometric view of a heat dissipation device in accordance with a preferred embodiment of the present invention, with an electronic component.
Figure 2:
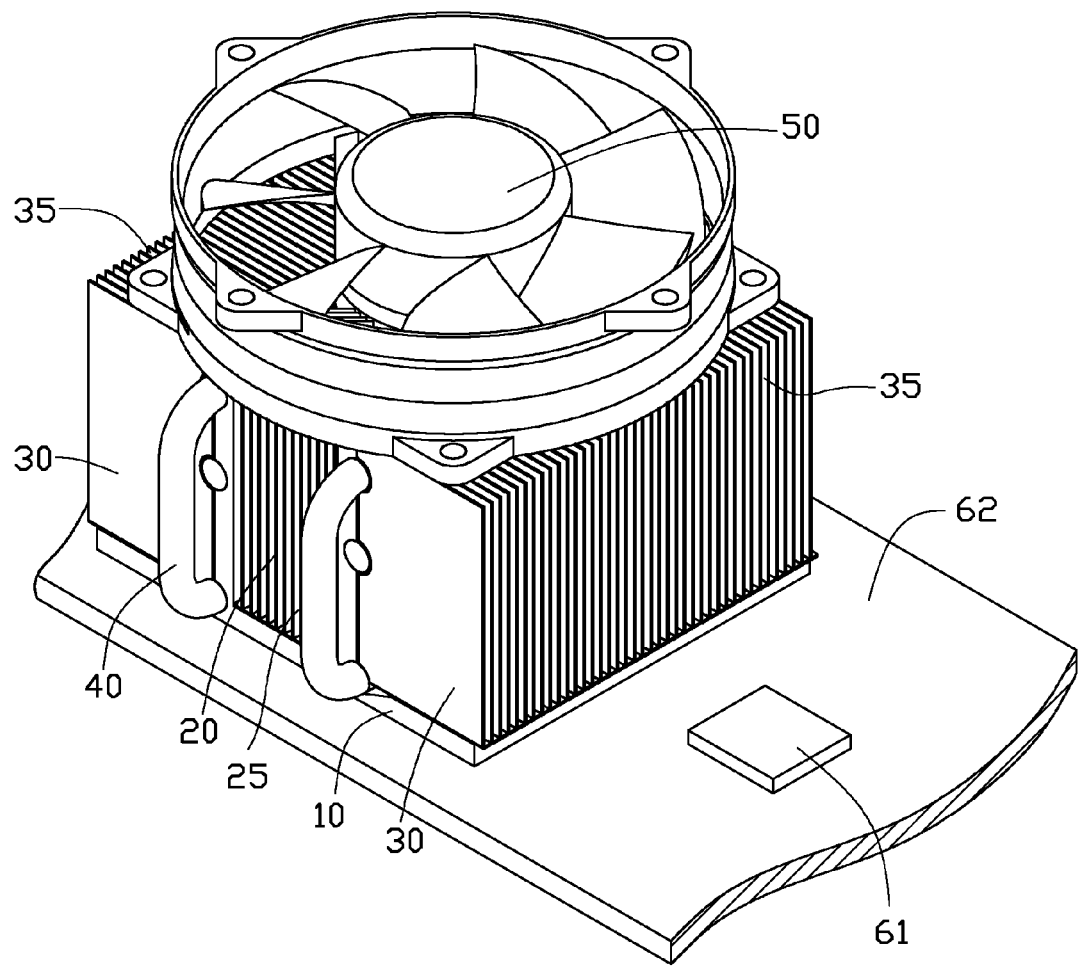
FIG. 2 is an assembled, isometric view of the heat dissipation device in FIG. 1.

Referring to FIGS. 1-2, a heat dissipation device in accordance with a preferred embodiment of the invention comprises a base 10, a first fin unit 20 and two second fin units 30 arranged on the base 10, two heat pipes 40 sandwiched between the second fin units 30 and the base 10 respectively, and a fan 50 mounted on the first and second fin units 20, 30.

The base 10 is integrally made of a high heat conductivity material such as copper or aluminum. The base 10 comprises a rectangular substrate 12 and two heat spreaders 13 extending upwardly from a top of the substrate 12. A bottom of the substrate 12 is for being attached to an electronic element 60, such as a CPU, to absorb heat generated by the electronic element 60.

The two heat spreaders 13 each are configured as a plate shape. The two heat spreaders 13 are parallel, spaced to each other and parallel to two short sides (i.e., a left side and a right side) of the substrate 12, and perpendicular to the substrate 12. A length of the heat spreaders 13 is equal to a width of the substrate 12 (i.e., a distance from a front side to a rear side thereof). A height of the heat spreaders 13 is similar to that of the first fin unit 20 and second fin sets 30. A distance between the heat spreaders 13 is similar to a width of the first fin unit 20, whereby the first fin unit 20 is fitly sandwiched between the heat spreaders 13. Three grooves 130 are defined in a lateral, outer side of each of the heat spreaders 13, to which a corresponding second fin unit 30 is attached. The grooves 130 are parallel to each other and parallel to the substrate 12, and a length thereof is equal to that of the heat spreaders 13. A first one of the grooves 130 is located adjacent to a top of each of the heat spreaders 13. A second groove 130 is located at a middle portion of each of the heat spreaders 13. A third groove 130 is located at a junction of each of the heat spreaders 13 and the substrate 12. An oblique leading surface 120 is formed in the top of the substrate 12, adjacent a corresponding heat spreader 13 and communicating with a corresponding third groove 130. The heat pipes 40 can be easily received in the third grooves 130 due to the setting of the leading surfaces 120.

The first fin unit 20 is arranged on the top of the substrate 12 and sandwiched between the heat spreaders 13. The first fin unit 20 is an assembly of pluralities of parallel fins 22. The fins 22 are perpendicular to the substrate 12 and parallel to the heat spreaders 13. Each of the fins 22 forms a vertical main body 221 and a flange 220 horizontally bending from a bottom thereof. The flanges 220 of the fins 22 connect together to form a flat surface attached to the top of the substrate 12. A plurality of first channels 25 is defined between the fins 22, each first channel 25 located between two corresponding adjacent fins 22. The first channels 25 extend along a direction parallel to the heat spreaders 13, i.e., a front-to-rear direction of the heat dissipation device.

The second fin units 30 are symmetrically located at two lateral, outer sides of the first fin unit 20 and are spaced from the first fin unit 20 by the heat spreaders 13. A height of the second fin units 30 is similar to that of the heat spreaders 13. Each of the second fin units 30 comprises a plurality of parallel fins 32 assembled together. The fins 32 are perpendicular to the substrate 12 and simultaneously perpendicular to the heat spreaders 13. Each of the fins 32 has a vertical main body 321 and a flange 320 bending from a bottom thereof. The flanges 320 connect together to form a flat surface attached to the top of the substrate 12. A plurality of second channels 35 is defined between the fins 32, each second channel 35 located between two corresponding adjacent fins 32. The second channels 35 extend along a direction perpendicular to the heat spreaders 13, i.e. a lateral direction of the heat dissipation device. Corresponding to the grooves 130 of the heat spreaders 13, three parallel grooves 37 are defined in a lateral, inner side of each of the second fin units 30. The grooves 37 and corresponding grooves 130 cooperatively receive the heat pipes 40 therein.

The heat pipes 40 have the same configuration and function to each other. Each of the heat pipes 40 stands in a vertical plane and has a G shape. Each of the heat pipes 40 comprises a horizontal evaporating portion 41, a first middle portion 42 and a second middle portion 43 extending upwardly from two opposite ends of the evaporating portion 41 respectively, a first condensing portion 44 extending horizontally from an end of the first middle portion 42 toward the second middle portion 43, and a second condensing portion 45 extending horizontally from an end of the second middle portion 43 toward the first middle portion 42. The first and second middle portions 42, 43 are parallel to each other. The evaporating portion 41, and the first and second condensing portions 44, 45 are parallel to each other. The first and second condensing portions 44, 45 extend inwards and are at different levels, where the second condensing portion 45 is located above the first condensing portion 44.

Figure 3:
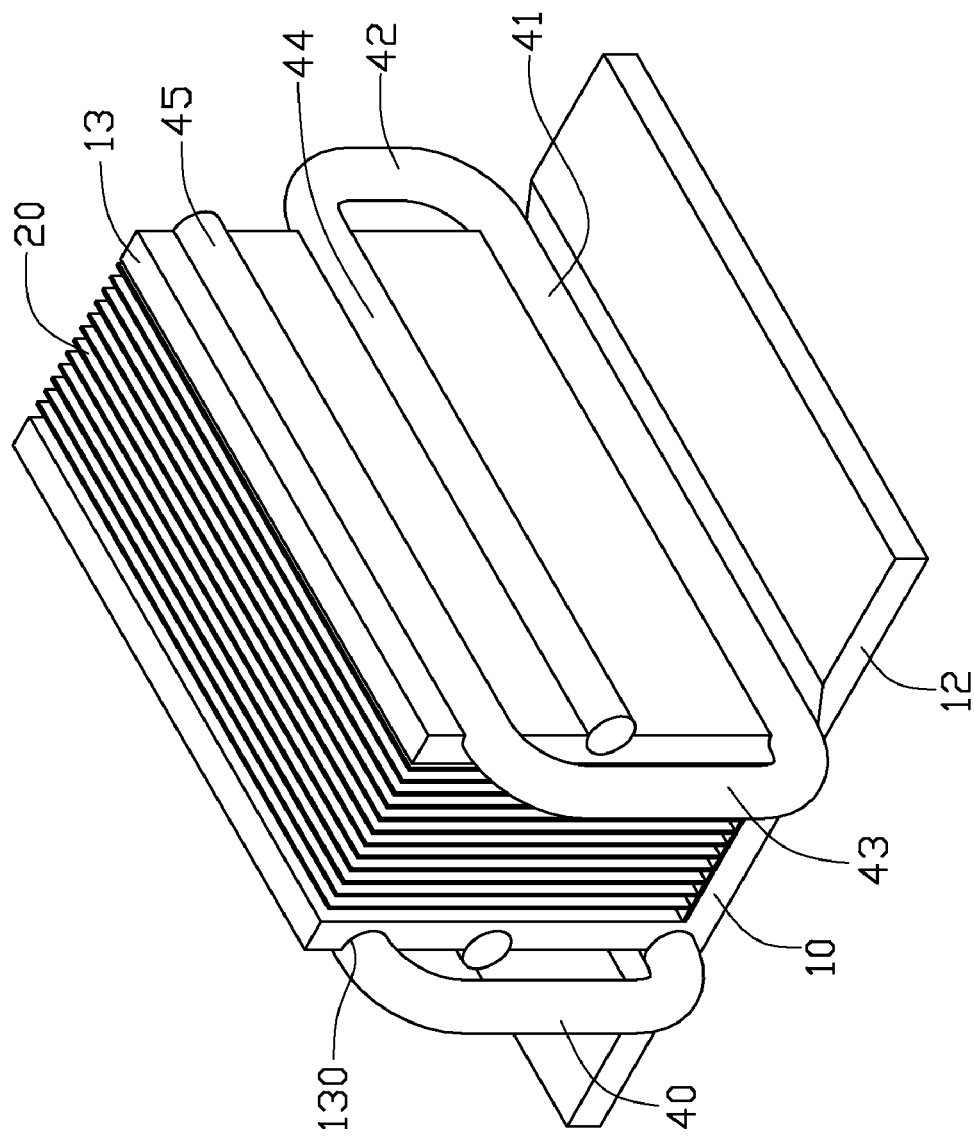
FIG. 3 is a partially assembled, isometric view of the heat dissipation device in FIG. 1 with two second fin units and a fan thereof being removed.
Figure 4:
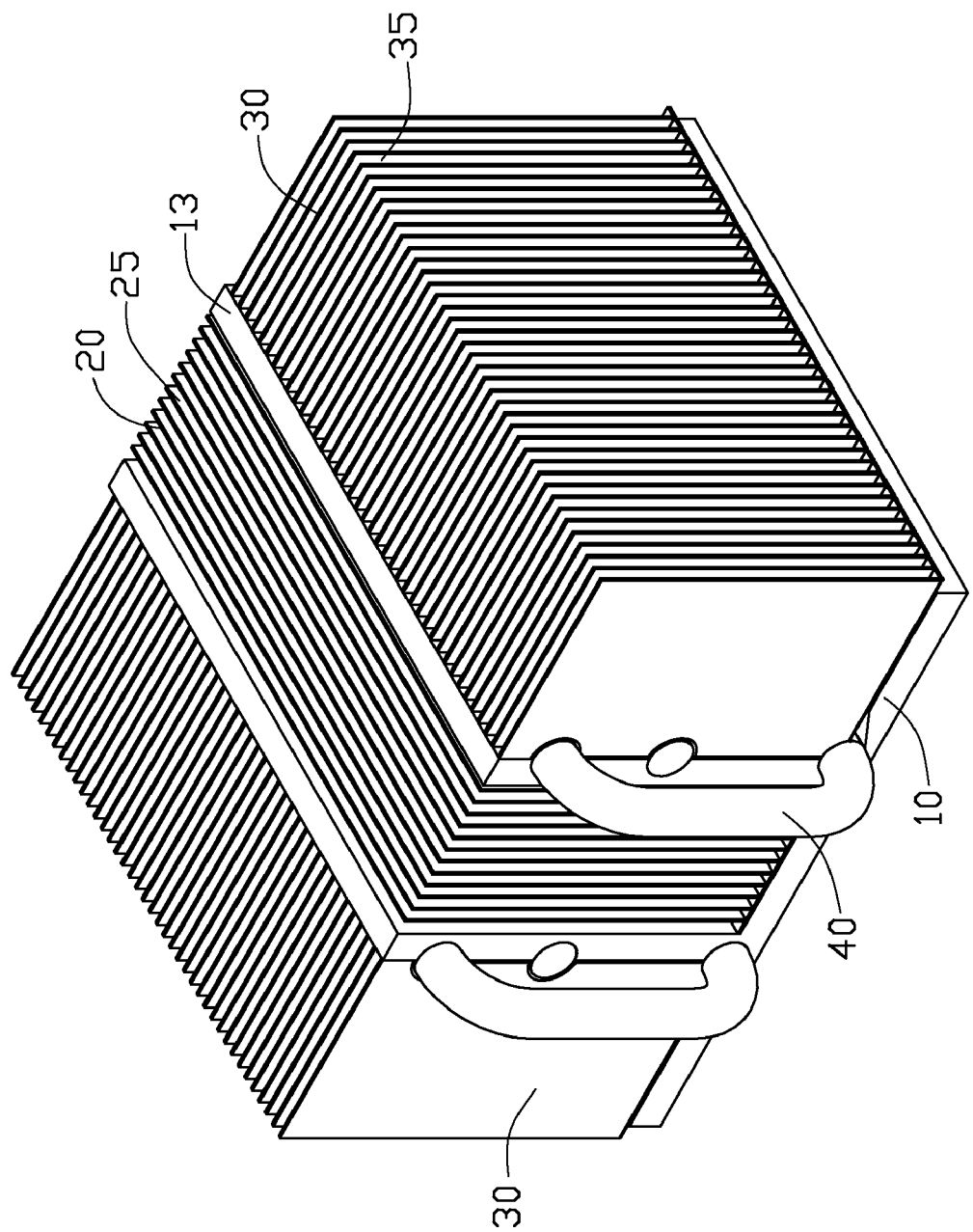
FIG. 4 is another partially assembled, isometric view of the heat dissipation device in FIG. 1 with the fan thereof being removed.

Please referring to FIG. 3 and FIG. 4, in assembly, the first fin unit 20 is arranged on the substrate 12 and sandwiched between the heat spreaders 13. The heat pipes 40 are received in the grooves 130 of the heat spreaders 13. Specifically, the evaporating portions 41 of the heat pipes 40 are received in the third grooves 130 located at the junctions of the substrate 12 and the heat spreaders 13. The first condensing portions 44 are received in the second grooves 130 located at the middle portion of the heat spreaders 13. The second condensing portions 45 are received in the first grooves 130 adjacent to the tops of the heat spreaders 13. The evaporating portions 41, the first and second condensing portions 44, 45 of the heat pipes 40 are parallel to the first fin unit 20.

The second fin units 30 are arranged on the substrate 12 and located at the lateral, outer sides of the heat spreaders 13, respectively. The grooves 37 of the second fin units 30 and the grooves 130 of the heat spreaders 13 cooperatively define passages to receive the evaporating portions 41, the first and second condensing portions 44, 45 of the heat pipes 40 therein. The first and second middle portions 42, 43 are exposed out of front and rear ends of the substrate 12, the heat spreaders 13, the first fin unit 20 and the second fin units 30. Tops of the heat spreaders 13, the first and second fin units 20, 30 are coplanar. The first and second channels 25, 35 are communicated with the tops of the first and second fin units 20, 30. Lastly, the fan 50 is mounted on the tops of the heat spreaders 13, the first and second fin units 20, 30.

In use, cooling air generated by the fan 50 can flow downwards to the first and second fin units 20, 30; then the cooling air can flow through the first and second channels 25, 35 out of the heat dissipation device. The first and second channels 25, 35 are perpendicular to each other and form an outlet in each of four sides of the heat dissipation device. Compared with the conventional heat dissipation device, the cooling air can flow out of the present heat dissipation device more rapidly, due to the multiple directions of the air outlets. Therefore, heat absorbed in the base 10 and the fin units 20, 30 can be dissipated to ambient areas more rapidly, thereby insuring that the electronic element 60 can always have a temperature within its normal working range.

Furthermore, since the cooling air is spread around the heat dissipation device, not only the electronic element 60, but other heat sources adjacent to any of the four sides of the heat dissipation device such as another electronic element 61 mounted on a printed circuit board 62 as shown in FIG. 2 can be cooled by the cooling air. Therefore, the cooling air generated by the fan 50 is well exploited.

In the present embodiment, an extending direction of the first channels 25 is along the front-to-rear direction of the heat dissipation device, while the first and second channels 25, 35 are perpendicular to each other. It is understood that extending direction of the second channels 35 could potentially be varied, so long as the extending direction of the second channels 35 is different from that of the first channels 25, thereby increasing the utilization of the cooling air generated by the fan 50. It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for cooling an electronic component, the heat dissipating device comprising:
   a base having a substrate with a bottom thereof for attaching to the electronic component, two heat spreaders integrally extending upwardly from a top of the substrate, the heat spreaders being parallel to each other;
   a first fin unit comprising a plurality of first parallel fins arranged on the substrate and sandwiched between the heat spreaders, the first fin unit defining pluralities of first channels therein;
   two second fin units each comprising a plurality of second parallel fins and arranged on the substrate and located at a lateral, outer side of one of the heat spreaders, each of the second fin units defining pluralities of second channels therein; and
   further comprising two heat pipes arranged on the substrate, each of the heat pipes being sandwiched between one of the heat spreaders and a corresponding one of the second fin units;
   wherein the plurality of second fins of the two second fin units are perpendicular to the heat spreaders, and the extending directions of the first and second channels are perpendicular to each other;
   wherein a plurality of grooves are defined in the heat spreaders and the second fin units for receiving the heat pipes therein; and
   wherein two of the grooves are defined in junctions of the heat spreaders and the substrate, respectively, and two oblique leading surfaces are formed in the top of the substrate and adjacent to the heat spreaders and communicate with the two of the grooves for facilitating assembly of the heat pipes into the two of the grooves.

2. The heat dissipation device as claimed in claim 1, wherein tops of the first fin unit, the second fin units and the heat spreaders are coplanar, the heat dissipating device further comprising a fan arranged on the tops of the first fin unit, the two second fin units and the heat spreaders.

3. The heat dissipation device as claimed in claim 1, wherein the each of the heat pipes comprises an evaporating portion attached to the substrate, first and second middle portions extending respectively from two ends of the evaporating portion, and first and second condensing portions extending respectively from the first and second middle portions.

4. The heat dissipation device as claimed in claim 3, wherein the each of the heat pipes has a G shape, the evaporating portion, and the first and second condensing portions thereof being parallel to each other and parallel to the fins of the first fin unit, the first and second middle portions being parallel to each other.

5. A heat dissipation device for cooling a major electronic component and other electronic components adjacent to the heat dissipation device, the heat dissipation device comprising:
  a base having a substrate and two parallel heat spreaders extending upwardly and perpendicularly from the substrate, the substrate being adapted for contacting with the major electronic component;
  a first fin unit arranged on the substrate and sandwiched between the heat spreaders, a plurality of first channels being defined in the first fin unit and parallel to the heat spreaders;
  two second fin units each being arranged on the substrate and located at a lateral, outer side of one of the heat spreaders, each of the second fin units defining a plurality of second channels therein, second fins of each the two second fin units extending in a direction perpendicular to the substrate and heat spreaders, and an extending direction of the second channels being perpendicular to that of the first channels;
  two heat pipes arranged on the substrate, each of the heat pipes being sandwiched between one of the heat spreaders and a corresponding one of the second fin units; and
  a fan arranged on the first and second fin units;
  wherein cooling air generated by the fan flows along the first and second channels out of the heat dissipation device multidirectionally, adapted for cooling the other electronic components adjacent to the heat dissipation devices
  wherein the each of the heat pipes has a G shape, and comprises an evaporating portion attached to the substrate, first and second middle portions extending respectively from two ends of the evaporating portion, and first and second condensing portions extending respectively from the first and second middle portions, the evaporating portion, and the first and second condensing portions being parallel to each other, the first and second middle portions being parallel to each other;
  wherein a plurality of grooves are defined in each of the heat spreaders and each of the second fin units for receiving the evaporating portion and the first and second condensing portions of the each of the heat pipes therein; and
  wherein one of the grooves defined in the each of the heat spreaders locates at a junction of the each of the heat spreaders and the substrate for receiving a corresponding evaporating portion of the each of the heat pipes, and an oblique leading surface is formed in the substrate and communicates with the one of the grooves for facilitating assembly of the corresponding evaporating portion in the one of the grooves.

6. The heat dissipation device as claimed in claim 5, further comprising the first fin unit comprising first fins, wherein the first fins and the second fins each comprise a vertical main body and a flange bent from an end of the main body, the flange being attached to the substrate.

* * * * *